(12) United States Patent
Winstead et al.

(10) Patent No.: US 7,488,635 B2
(45) Date of Patent: Feb. 10, 2009

(54) SEMICONDUCTOR STRUCTURE WITH REDUCED GATE DOPING AND METHODS FOR FORMING THEREOF

(75) Inventors: Brian A. Winstead, Austin, TX (US); James D. Burnett, Austin, TX (US); Sinan Goktepeli, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 25 days.

(21) Appl. No.: 11/260,849

(22) Filed: Oct. 26, 2005

(65) Prior Publication Data

US 2007/0093043 A1  Apr. 26, 2007

(51) Int. Cl.
  *H01L 21/8238* (2006.01)
(52) U.S. Cl. .................. 438/199; 438/217; 438/229; 438/527; 438/528
(58) Field of Classification Search .............. 438/514, 438/510, 289, 403, 521, 199, 217, 229, 527, 438/528
  See application file for complete search history.

(56) References Cited

U.S. PATENT DOCUMENTS

| | | | |
|---|---|---|---|
| 4,555,301 A * | 11/1985 | Gibson et al. ............ 117/44 |
| 5,652,162 A | 7/1997 | Liao | |
| 5,885,877 A * | 3/1999 | Gardner et al. ............. 438/300 |
| 5,933,721 A * | 8/1999 | Hause et al. ................ 438/217 |
| 6,100,568 A * | 8/2000 | Lage ......................... 257/392 |
| 6,225,151 B1 * | 5/2001 | Gardner et al. ............. 438/162 |
| 6,348,719 B1 * | 2/2002 | Chapman .................... 257/412 |
| 6,667,524 B1 * | 12/2003 | Sakakibara ................. 257/391 |
| 6,878,578 B1 | 4/2005 | Twu et al. | |
| 7,112,857 B2 * | 9/2006 | Liaw .......................... 257/392 |
| 2001/0044185 A1 | 11/2001 | Nomoto et al. | |
| 2002/0084493 A1 * | 7/2002 | Marshall et al. ............ 257/369 |
| 2003/0173625 A1 * | 9/2003 | Choi .......................... 257/369 |
| 2003/0218218 A1 * | 11/2003 | Chaudhry et al. .......... 257/391 |

* cited by examiner

*Primary Examiner*—Minh-Loan T Tran
*Assistant Examiner*—Minchul Yang

(57) ABSTRACT

A semiconductor structure includes a substrate having a memory region and a logic region. A first p-type device is formed in the memory region and a second p-type device is formed in the logic region. At least a portion of a semiconductor gate of the first p-type device has a lower p-type dopant concentration than at least a portion of a semiconductor gate of the second p-type device. The semiconductor gates of the first and second p-type devices each have a non-zero p-type dopant concentration.

19 Claims, 5 Drawing Sheets

SEMICONDUCTOR STRUCTURE WITH REDUCED GATE DOPING AND METHODS FOR FORMING THEREOF

FIELD OF THE INVENTION

The present invention relates generally to semiconductor structures and methods, and more particularly to a semiconductor structure with reduced gate doping and methods for forming thereof.

RELATED ART

Increasingly lower-power semiconductor structures are needed to reduce power requirements of integrated circuits, such as memory devices. Memory devices, such as SRAMS, are typically implemented using bitcells, whose performance is a function of many parameters including semiconductor techniques used to implement the bitcells. SRAM bitcell functionality and performance, among other things, depends on the write margin of the bitcell. Higher write margin enables one to change the state of a bitcell using a lower voltage. Lower voltage correspondingly results in lower power consumption by the bitcell and thus the memory using the bitcell. However, conventional memory devices require higher voltage to perform a state change of the bitcell resulting in higher power consumption. Thus, there is a need for an improved semiconductor structure that results in a higher write margin for bitcells without degrading read performance for memory devices, such as SRAMs.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE EMBODIMENTS

In one aspect, a method for forming a semiconductor structure is provided. The method includes providing a substrate having a memory region and a logic region. The method further includes forming a first p-type device in the memory region and a second p-type device in the logic region, wherein at least a portion of a semiconductor gate of the first p-type device has a lower p-type dopant concentration than at least a portion of a semiconductor gate of the second p-type device, and wherein the semiconductor gates of the first and second p-type devices each have a non-zero p-type dopant concentration.

In another aspect, a method for forming a semiconductor structure is provided. The method includes providing a substrate having a memory region and a logic region. The method further includes forming a semiconductor gate layer over the gate dielectric layer. The method further includes patterning the semiconductor gate layer to form a first semiconductor gate in the memory region and a second semiconductor gate in the logic region, wherein at least a portion of the first semiconductor gate has a lower dopant concentration of the first conductivity type than a portion of the second semiconductor gate. The method further includes performing a diffusion-reducing implant in the memory region. The method further includes forming source/drain regions in the substrate, adjacent the first semiconductor gate.

In yet another aspect, a semiconductor structure comprising a substrate having a memory region and a logic region is provided. The semiconductor structure further includes a first p-type device in the memory region. The semiconductor structure further includes a second p-type device in the logic region, wherein at least a portion of a semiconductor gate of the first p-type device has a lower p-type dopant concentration than at least a portion of a semiconductor gate of the second p-type device, and wherein the semiconductor gates of the first and second p-type devices each have a non-zero p-type dopant concentration.

Figure 1:
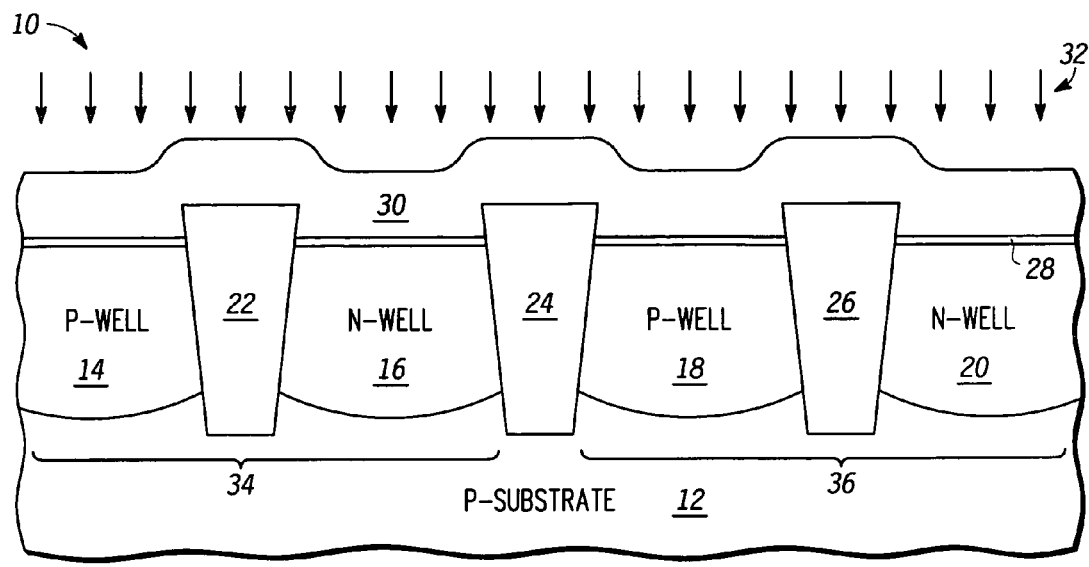
FIG. 1 is a drawing of a semiconductor structure with a memory region and a logic region, consistent with a process step of one embodiment of the invention.

FIG. 1 is a drawing of a semiconductor structure 10 with a memory region 34 and a logic region 36, consistent with a process step of one embodiment of the invention. Using semiconductor processing techniques, such as ion implantation, in a p-type substrate 12, p-type well regions 14, 18 and n-type well regions 16, 20 may be formed. The p-type well regions 14, 18 and the n-type well regions 16 and 20 may be separated by dielectrics 22, 24, and 26, each of which may serve as a shallow trench isolation. Different regions of semiconductor structure 10 may serve as memory region 34 and logic region 36. By way of example, memory region 34 may include memory devices, such as SRAM bitcells, whereas logic region 36 may include logic devices. As part of this process step, a gate layer 30 may be deposited on top of a gate dielectric layer 28. By way of example, gate layer 30 may be any suitable semiconductor material.

Still referring to FIG. 1, next, a p-type blanket implant 32 may be implanted into gate layer 30. P-type blanket implant 32 may be implanted into a portion of gate layer 30 or the entire gate layer 30. Any suitable p-type dopant, such as boron, BF2, indium, gallium, and/or other suitable dopants may be used. By way of example, the implantation energy of boron may be in a range between 5 to 15 keV. By way of example, the dosage of boron may be in a range between 1e14 atoms per square centimeter to 1e15 atoms per square centimeter. This may result in a cumulative p-type concentration in the semiconductor gate of the p-type devices in memory region 34 in a range of approximately 1e18 atoms per cubic centimeter to 5e19 atoms per cubic centimeter. Similar doping concentration in the semiconductor gate of p-type dopant may be achieved using other suitable techniques, such as in-situ doping during gate deposition. For example, in FIG. 1, gate layer 30 may be in-situ doped during gate deposition.

The dosage for the p-type dopant may be selected to provide a relatively lower doping concentration for at least portions of gate areas in p-type devices in memory region 34 than the doping concentration for at least portions of gate areas in p-type devices in logic region 36. In particular, at least the portions of gate areas above the gate dielectric in memory region 34 may have a lower doping concentration than at least the portions of gate areas above the gate dielectric in logic region 36. As used herein, the term "doping concentration" refers to active dopant concentration. The n-type devices corresponding to memory region 34 and logic region 36 may be doped using conventional semiconductor processing techniques. However, their doping concentration may need to be altered to account for the p-type blanket implant 32. In any case, the doping concentration for gate areas for p-type devices in memory region 34 and for gate areas for p-type devices in logic region 36 may be non-zero. Although FIG. 1 shows both n-type and p-type well regions, embodiments of the present invention may be implemented without the p-type well regions.

Figure 2:
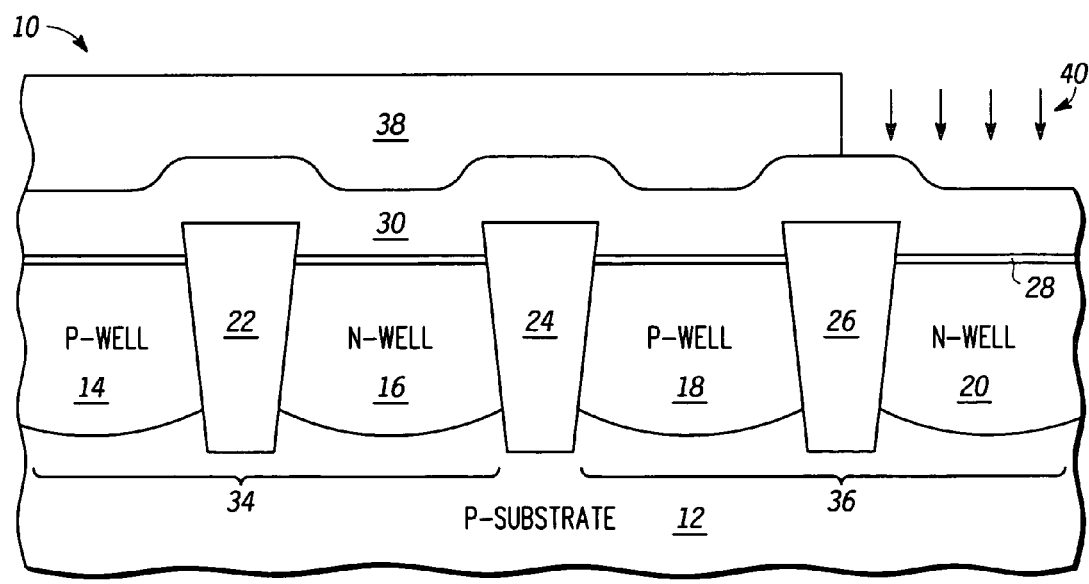
FIG. 2 is a drawing of a semiconductor structure of FIG. 1 with a gate layer and a p-type implantation for the logic device, consistent with a process step of one embodiment of the invention.

FIG. 2 is a drawing of a semiconductor structure of FIG. 1 with a gate layer and p-type implantation for the logic devices, consistent with a process step of one embodiment of the invention. As part of this process step, p-type devices corresponding to logic region 36 may be doped using p-type implant 40 more heavily than the p-type devices corresponding to memory region 34. Alternatively, p-type devices corresponding to logic region 36 may be doped with the same dopant level as the p-type devices corresponding to memory region 34. P-type devices in memory region 34 may be used as load devices or pull-up devices for a SRAM bitcell. N-type devices in memory region 34 may be used as latch and/or pass-gate devices for the SRAM bitcell. As shown, devices other than the p-type devices corresponding to logic region 36 may be masked using mask 38. Although not shown, n-type devices may be doped using conventional semiconductor processing techniques.

Figure 3:
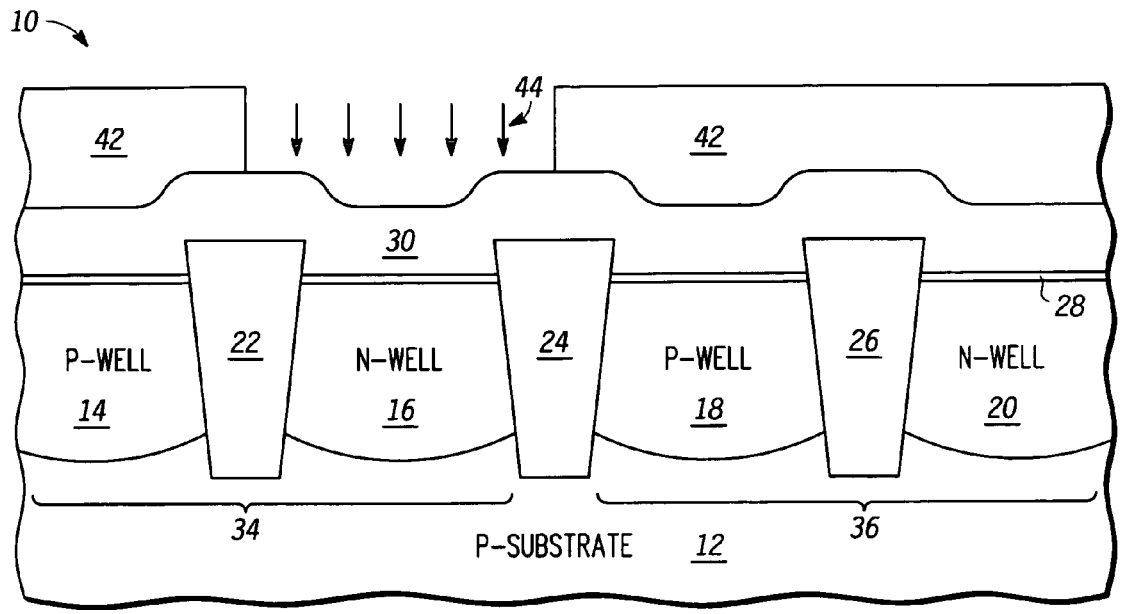
FIG. 3 is a drawing of a semiconductor structure of FIG. 2 with diffusion-reducing implant, consistent with a process step of one embodiment of the invention.

FIG. 3 is a drawing of a semiconductor structure of FIG. 2 with implantation of a diffusion-reducing implant 44, consistent with a process step of one embodiment of the invention. As part of this process, semiconductor structure 10 may be masked using masking layer 42 at all places except p-type devices corresponding to memory region 34. Next, diffusion-reducing implant 44 may be implanted into p-type devices corresponding to memory region 34. Although not shown in FIG. 2, diffusion-reducing implant 44 may implanted into p-type devices corresponding to both memory region 34 and logic region 36, however, p-type devices in memory region 34 may be subjected to higher amounts of diffusion-reducing implants. By way of example, diffusion-reducing implants 44 may include nitrogen, carbon, and germanium. By way of example, the implantation energy of nitrogen may be in a range between 2 to 10 keV. By way of example, the dosage of nitrogen may be in a range between 5e14 atoms per square centimeter to 5e15 atoms per square centimeter. By way of example, the implantation energy of carbon may be in a range between 5 to 10 keV. By way of example, the dosage of carbon may be in a range between 5e14 atoms per square centimeter to 5e15 atoms per square centimeter. In one embodiment, rather than performing the steps shown in FIG. 1 relating to a p-type blanket implant 32, mask 42 may be used to perform a p-type implant into p-type devices corresponding to memory region 34. Diffusion-reducing implant 44 may be implanted either before implanting p-type implant or after implanting p-type implant.

Figure 4:
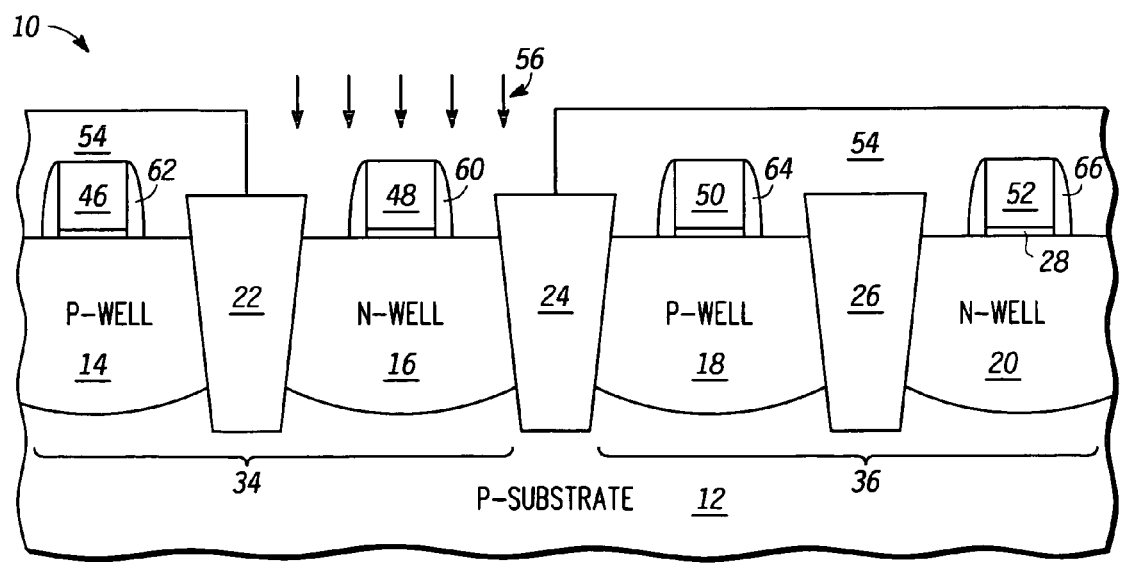
FIG. 4 is a drawing of a semiconductor structure where diffusion-reducing implant is performed at a different step than the process step of FIG. 3, consistent with a process step of one embodiment of the invention.

FIG. 4 is a drawing of a semiconductor structure where diffusion-reducing implant is performed at a different step than the process step of FIG. 3, consistent with a process step of one embodiment of the invention. As shown, diffusion-reducing implant 56 may be implanted after gates 46, 48, 50, 52 and spacers 60, 62, 64, and 66 have been formed. As part of this step, using mask 54 p-type devices other than the ones in memory region 34 may be masked. Diffusion-reducing implant 56 may be nitrogen, carbon, or germanium and may have similar implantation energy and dosage as discussed above with respect to FIG. 3. Although FIG. 4 shows spacers 60, 62, 64, and 66, diffusion-reducing implant 56 may be implanted before these spacers are formed.

Figure 5:
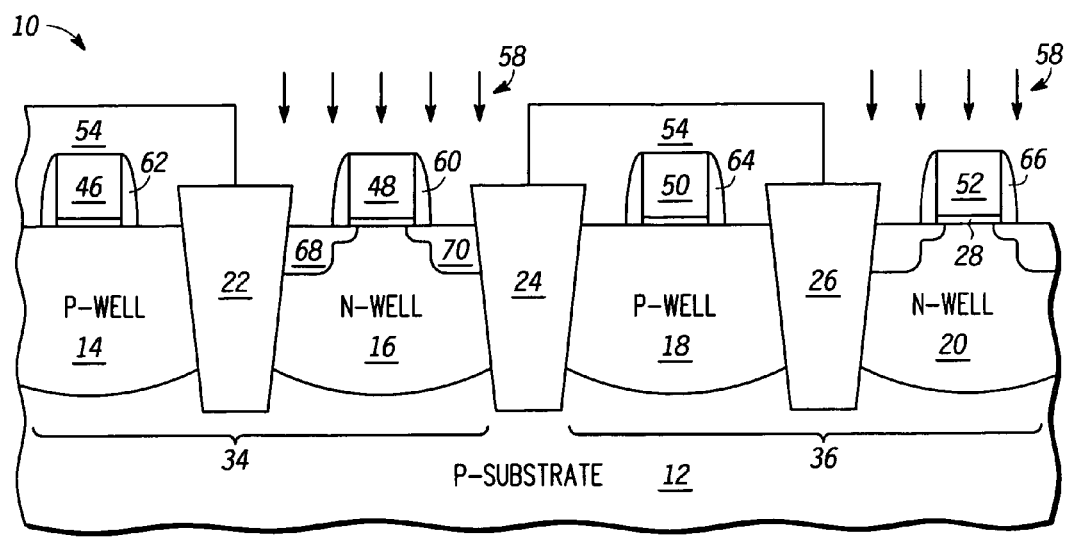
FIG. 5 is a drawing of a semiconductor structure of FIG. 4 with source/drain implants, consistent with a process step of one embodiment of the invention.

FIG. 5 is a drawing of a semiconductor structure of FIG. 4 with source/drain implants, consistent with a process step of one embodiment of the invention. As part of this step, source/drain implants 58 may be implanted using conventional semiconductor processing techniques to form source-drain regions 68, 70. Source/drain regions may be formed using techniques other than implantation, such as in-situ doped epitaxial growth. This step may be performed before or after the step of FIG. 4. After implanting source/drain implants 58, source/drain implants may be performed for other devices of semiconductor structure 10. Next, source/drain regions 68, 70 may be annealed to activate the dopants. Source/drain regions 68, 70 may be annealed using a low thermal budget anneal to minimize diffusion.

Figure 6:
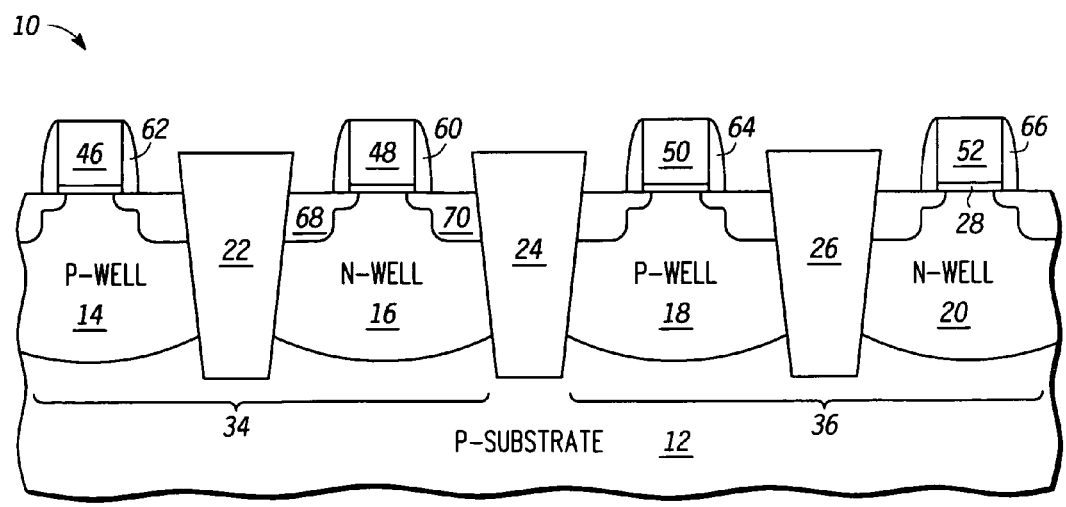
FIG. 6 is a drawing of a semiconductor structure with source/drain regions and spacers, consistent with a process step of one embodiment of the invention.

FIG. 6 is a drawing of a semiconductor structure with source-drain regions and spacers formed, consistent with a process step of one embodiment of the invention. P-type devices corresponding to memory region 34 may have a relatively lower doping concentration for gate areas compared to the doping concentration of gate areas of p-type devices corresponding to logic region 36. Additionally and/or alternatively, only the p-type devices corresponding to memory region 34 may have a diffusion-reducing implant, as discussed above with respect to FIG. 3 or 4. Lower doping concentration for gate areas in p-type devices in memory region 34 results in a lower on current for the semiconductor devices in memory region 34, while having a minimal effect on threshold voltage. When used as the load device in a SRAM bitcell, this weaker device results in a lower voltage needed to write to the bitcell.

Figure 7:
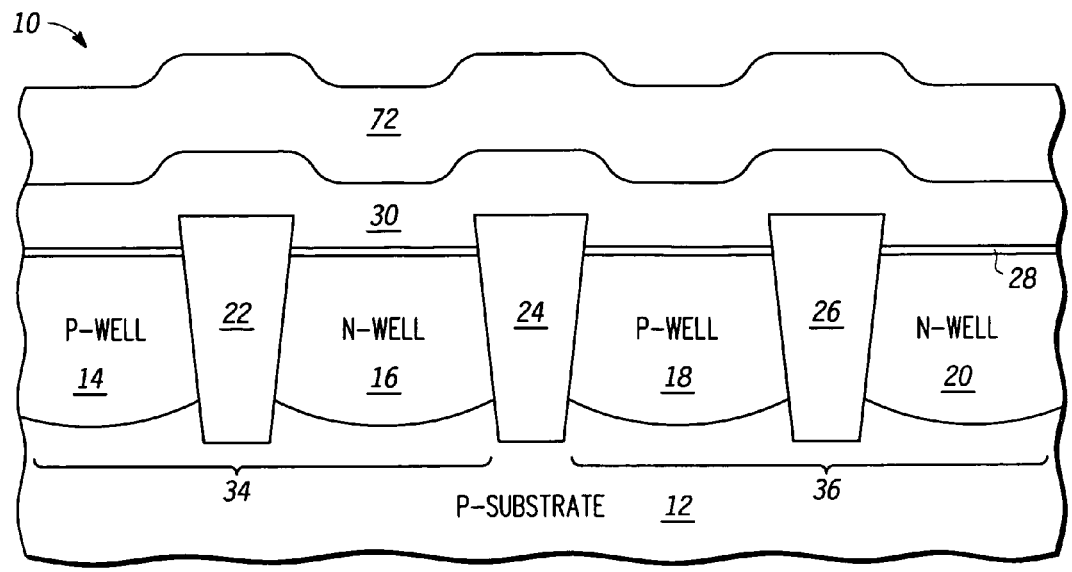
FIG. 7 is a drawing of a semiconductor structure with a hard mask, consistent with a process step of one embodiment of the invention.
Figure 8:
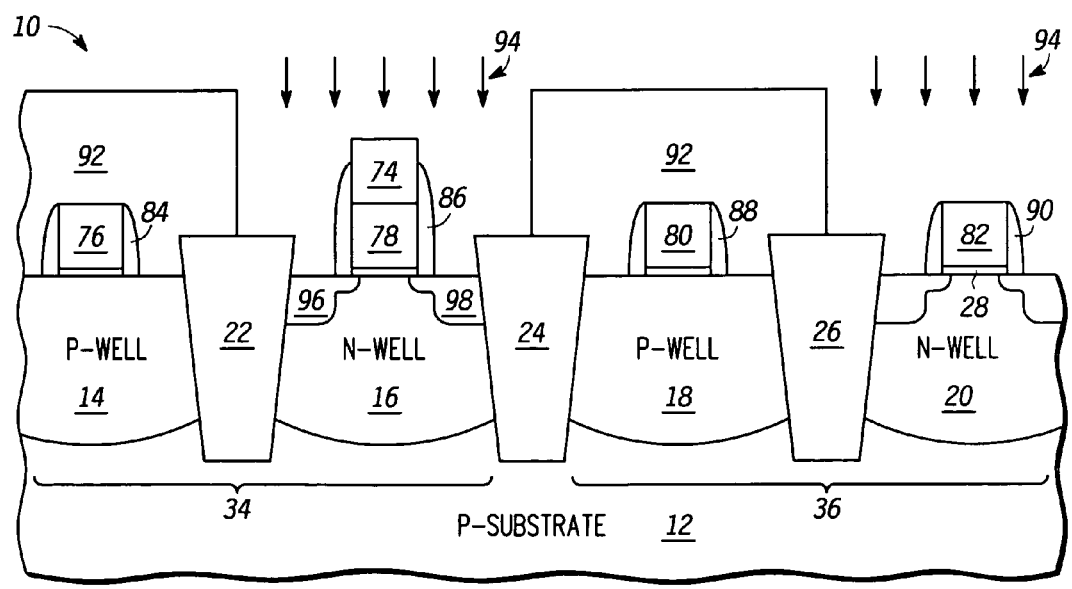
FIG. 8 is a drawing of a semiconductor structure with a source/drain region and spacers, consistent with a process step of one embodiment of the invention.

FIG. 7 is a drawing of a semiconductor structure with a hard mask 72, consistent with a process step of one embodiment of the invention. Hard mask 72 may be formed using conventional semiconductor processing techniques over gate layer 30. By way of example, hard mask may comprise silicon nitride, silicon oxide, silicon oxy-nitride, or poly-crystalline silicon germanium, or other suitable materials and combinations thereof. This step may be performed after the steps shown in FIGS. 1, 2, and 3. Next, gate layer 30 and hard mask 72 may be patterned and etched to form gate areas. Then, hard mask 72 may be removed from gate areas, except from over the gate areas of p-type devices in memory region 34. Referring to FIG. 8, this would result in the formation of a gate stack over p-type devices in memory region 34 having a gate 78 and a hard mask portion 74.

FIG. 8 is a drawing of a semiconductor structure with a source-drain region and spacers, consistent with a process step of one embodiment of the invention. As part of this step, source/drain implants 94 may be implanted using conventional semiconductor processing techniques to form source-drain regions 96, 98. By way of example, mask 92 may be used to mask n-type devices, as part of this step. Hard mask portion 74 may block source/drain implants 94 from gate 78 corresponding to p-type devices in memory region 34. Thus, p-type devices in memory region 34 may have gates that do not receive dopants from the source/drain implants 94. Spacers 84, 86, 88, and 90 may be formed prior to source/drain implants 94. Additional steps, such as halo implantation and extension implantation may be performed prior to forming spacers 84, 86, 88, and 90.

Figure 9:
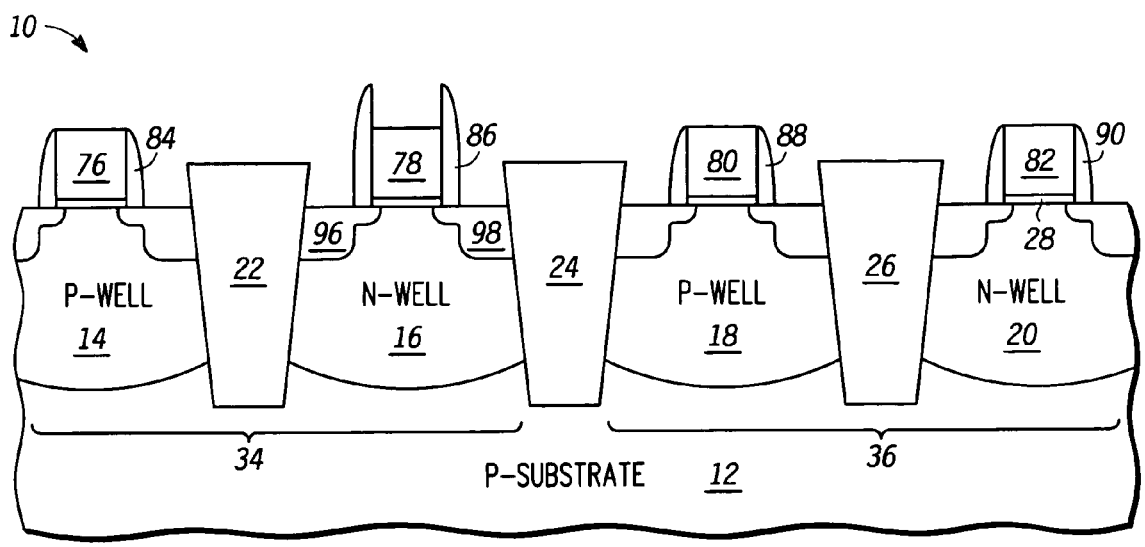
FIG. 9 is a drawing of a semiconductor structure of FIG. 8 with source/drain regions and spacers, consistent with a process step of one embodiment of the invention.

FIG. 9 is a drawing of a semiconductor structure of FIG. 8 with source/drain regions and spacers, consistent with a process step of one embodiment of the invention. Hard mask portion 74 may be removed using conventional etching techniques.

Although the above processes and the semiconductor structure are described using exemplary lower concentration doping of p-type devices, n-type devices may also be doped with a lower concentration dopant consistent with an alternative embodiment of the invention. Thus, for example, where a SRAM uses n-type devices as load devices and p-type devices as latch devices, n-type devices corresponding to memory region 34 may be doped with a lower dopant concentration resulting in weaker n-type devices. The weaker n-type devices may improve the write margin of a SRAM that employs the weaker n-type devices as load devices. The p-type devices corresponding to memory region 34 and logic region 36 may be doped using conventional semiconductor processing techniques. Additionally, although the above processes and the semiconductor structure are described using planar structures, non-planar processes and semiconductor structures may also be formed using the above processes. Thus, for example, FinFETs and similar other non-planar structures may also be formed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure comprising:
    providing a substrate having a memory region and a logic region; and forming a first p-type device in the memory region and a second p-type device in the logic region, wherein at least a portion of a semiconductor gate of the first p-type device has a lower p-type dopant concentration than at least a portion of a semiconductor gate of the second p-type device, the semiconductor gates of the first and second p-type devices each having a non-zero p-type dopant concentration, wherein forming further comprises:
        performing a diffusion-reducing implant in a semiconductor gate layer corresponding to the first p-type device and the second p-type device, and wherein the memory region further comprises a first device region having p-type devices and a second device region having n-type devices, and wherein the diffusion-reducing implant is performed in the semiconductor gate layer in only the first device region of the memory region, prior to forming the semiconductor gates of the first and second p-type devices.

2. The method of claim 1, wherein forming further comprises:
    performing a first p-type implant into a portion of the semiconductor gate layer used to form the semiconductor gate of the first p-type device;
    performing a second p-type implant into a portion of the semiconductor gate layer used to form the semiconductor gate of the second p-type device, wherein the first p-type implant uses a lower p-type dose than the second p-type implant; and
    patterning the semiconductor gate layer to form the semiconductor gates of the first and second p-type devices.

3. The method of claim 2, wherein the first p-type implant is a blanket implant into the semiconductor gate layer.

4. The method of claim 1, wherein the diffusion-reducing implant is performed using a species selected from a group consisting of nitrogen, carbon, and germanium.

5. The method of claim 1, wherein forming further comprises:
    forming a source/drain region in the substrate adjacent each side of the semiconductor gate of the first p-type device, the source/drain regions extending under the semiconductor gate of the first p-type device; and
    performing an anneal, wherein the diffusion-reducing implant is performed into the semiconductor gate of the first p-type device prior to the anneal.

6. The method of claim 1, wherein the diffusion-reducing implant is selectively implanted into a portion of the semiconductor gate layer that is used to form the semiconductor gate of the first p-type device.

7. The method of claim 1, wherein forming further comprises:
    forming a hardmask layer over the semiconductor gate layer; and
    forming the semiconductor gates of the first and second p-type devices; and
    performing a source/drain implant to form source/drain regions adjacent the semiconductor gate of the first p-type device, wherein a portion of the hardmask layer remains over the semiconductor gate of the first p-type device during the source/drain implant.

8. The method of claim 1, wherein forming further comprises:
    depositing an in-situ p-type doped semiconductor gate layer over the substrate; and
    patterning the in-situ p-type doped semiconductor gate layer to form the semiconductor gates of the first and second p-type devices.

9. A method for forming a semiconductor structure comprising:
    providing a substrate having a memory region and a logic region;
    forming a gate dielectric layer over the substrate;
    forming a semiconductor gate layer over the gate dielectric layer;
    patterning the semiconductor gate layer to form a first semiconductor gate in the memory region and a second semiconductor gate in the logic region, wherein at least a portion of the first semiconductor gate has a lower dopant concentration of the first conductivity type than at least a portion of the second semiconductor gate;

performing a diffusion-reducing implant in the memory region, wherein the memory region further comprises a first device region having devices of the first conductivity type and a second device region having devices of a second conductivity type, and wherein the diffusion-reducing implant is performed in the semiconductor gate layer in only the first device region of the memory region, prior to forming the first and second semiconductor gates; and forming source/drain regions in the substrate, adjacent the first semiconductor gate.

10. The method of claim 9, further comprising:

performing a first implant having the first conductivity type into the semiconductor gate layer.

11. The method of claim 10, wherein the first implant is performed as a blanket implant.

12. The method of claim 10, further comprising:

performing a second implant having the first conductivity type into the semiconductor gate layer in the logic region while masking the semiconductor gate layer in the memory region, wherein the second implant is performed either prior to or after the first implant.

13. The method of claim 10, wherein the memory region further comprises a first device region having devices of the first conductivity type and a second device region having devices of a second conductivity type, and wherein the first implant is performed in only the first device region of the memory region.

14. The method of claim 9, wherein the diffusion-reducing implant comprises a species selected from a group consisting of nitrogen, carbon, and germanium.

15. The method of claim 9, wherein the diffusion-reducing implant is performed into the first semiconductor gate.

16. The method of claim 15, wherein the diffusion-reducing implant comprises a species selected from a group consisting of nitrogen, carbon, and germanium.

17. The process of claim 9, further comprising:

forming a hardmask layer over the semiconductor gate layer, wherein a portion of the hardmask layer remains over the first semiconductor gate during the forming of the source/drain regions.

18. The method of claim 9, wherein the first conductivity type is p-type.

19. The method of claim 9, wherein forming the semiconductor gate layer comprises depositing an in-situ doped layer having a dopant concentration of the first conductivity type.

* * * * *